(12) United States Patent
Tan

(10) Patent No.: US 12,433,041 B2
(45) Date of Patent: Sep. 30, 2025

(54) ARRAY SUBSTRATE WITH QUASI-OHMIC CONTACT LAYER AND PHOTOSENSITIVE SEMICONDUCTOR LAYER AND DISPLAY PANEL

(71) Applicant: TCL CHINA STAR OPTOELECTRONICS TECHNOLOGY CO., LTD., Guangdong (CN)

(72) Inventor: Yanlan Tan, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/759,869

(22) PCT Filed: Jul. 28, 2022

(86) PCT No.: PCT/CN2022/108680
§ 371 (c)(1),
(2) Date: Aug. 1, 2022

(87) PCT Pub. No.: WO2024/007386
PCT Pub. Date: Jan. 11, 2024

(65) Prior Publication Data
US 2024/0186339 A1   Jun. 6, 2024

(30) Foreign Application Priority Data
Jul. 6, 2022 (CN) .......................... 202210795694.7

(51) Int. Cl.
*H10F 39/10* (2025.01)
*G02F 1/1368* (2006.01)
(Continued)

(52) U.S. Cl.
CPC ......... *H10F 39/107* (2025.01); *G02F 1/1368* (2013.01); *H10D 86/423* (2025.01); *H10D 86/60* (2025.01)

(58) Field of Classification Search
CPC ............................. G02F 1/1368; G02F 1/1362
See application file for complete search history.

(56) References Cited

U.S. PATENT DOCUMENTS

2010/0315584 A1* 12/2010 Cho .................. G02F 1/134363
349/141
2011/0186845 A1    8/2011 Yamayoshi et al.
(Continued)

FOREIGN PATENT DOCUMENTS

CN    108475700 A    8/2018
CN    111244196 A    6/2020
(Continued)

OTHER PUBLICATIONS

International Search Report in International application No. PCT/CN2022/108680, mailed on Dec. 27, 2022.
(Continued)

*Primary Examiner* — Lauren Nguyen

(57) ABSTRACT

An array substrate and a display panel are provided. The array substrate includes a base and a thin-film transistor disposed on a side of the base, and a turn-on voltage of a gate of the thin-film transistor can be reduced by a sensing effect of the thin-film transistor on external or internal light, so that power consumption of the display panel can be reduced.

20 Claims, 3 Drawing Sheets

(51) Int. Cl.
  *H10D 86/40* (2025.01)
  *H10D 86/60* (2025.01)

(56) References Cited

U.S. PATENT DOCUMENTS

2015/0008434 A1   1/2015  Yang et al.
2015/0145840 A1   5/2015  Lim et al.
2019/0035935 A1*  1/2019  Nakazawa .......... H01L 27/1225

FOREIGN PATENT DOCUMENTS

CN    113113427 A       7/2021
CN    113363343 A       9/2021
WO    WO-2015-102746  * 9/2015  ............. H01L 29/43

OTHER PUBLICATIONS

Written Opinion of the International Search Authority in International application No. PCT/CN2022/108680, mailed on Dec. 27, 2022.
Chinese Office Action issued in corresponding Chinese Patent Application No. 202210795694.7 dated Apr. 26, 2025, pp. 1-6.

* cited by examiner

ARRAY SUBSTRATE WITH QUASI-OHMIC CONTACT LAYER AND PHOTOSENSITIVE SEMICONDUCTOR LAYER AND DISPLAY PANEL

FIELD OF DISCLOSURE

The present disclosure relates to the field of display technology, and more particularly, to an array substrate and a display panel.

BACKGROUND OF DISCLOSURE

In recent years, liquid crystal display (LCD) panels have been widely used in many fields in recent years, and continue to show a rapid growth trend. Each pixel in a liquid crystal display panel distributed in a matrix formed in thin-film transistors in liquid crystal display devices are now widely used. In this active matrix liquid crystal display panel, through applying scan pulses and voltage applied by a data line to pixel electrodes, inversions of liquid crystals in a liquid crystal layer at corresponding positions are achieved, so as to achieve a purpose of display.

When a positive voltage is input to the data line connected to a source of a thin-film transistor, a voltage of the source of the thin-film transistor is equivalent to a positive voltage. In order to achieve turning on of the thin-film transistor, applying a larger turn-on voltage of the gate of the thin-film transistor is required to satisfy that a voltage difference between a gate and the source exceeding a turn-on threshold of the thin-film transistor. Since the thin-film transistor generally requires a relatively large turn-on voltage of the gate, a large amount of power consumption is formed in the thin-film transistor.

In sum, a conventional display panel has a problem that the power consumption increases due to the large turn-on voltage of the gate of the thin-film transistor. Therefore, it is necessary to provide an array substrate and a display panel to improve this defect.

SUMMARY

The present application provides an array substrate and a display panel that can reduce a turn-on voltage of a gate of a thin-film transistor, thereby reducing energy consumption of the display panel.

The present application provides an array substrate including:
a base; and
a thin-film transistor disposed on a side of the base, wherein the thin-film transistor includes:
a gate;
an active layer disposed on a side of the gate;
a source disposed on a side of the active layer away from the gate and in contact with the active layer;
a drain disposed on the side of the active layer away from the gate and in contact with the active layer, wherein a gap is defined between the source and the drain;
a quasi-ohmic contact layer disposed on the side of the active layer away from the gate, wherein the quasi-ohmic contact layer is electrically connected to the drain; and
a photosensitive semiconductor layer disposed on the side of the active layer away from the gate, wherein the photosensitive semiconductor layer is respectively electrically connected to the source and the quasi-ohmic contact layer.

According to an embodiment of the present application, an end of the quasi-ohmic contact layer is overlapped on a side of the drain that is away from the active layer, and two opposite ends of the photosensitive semiconductor layer are respectively overlapped on a side of the source away from the active layer and a side of the quasi-ohmic contact layer away from the active layer.

Through adding the photosensitive semiconductor layer and the quasi-ohmic contact layer on the thin-film transistor, the two ends of the photosensitive semiconductor layer are respectively overlapped on the source and the quasi-ohmic contact layer, and an end of the quasi-ohmic contact layer is overlapped on the drain of the thin-film transistor. The photosensitive semiconductor layer as well as the quasi-ohmic contact layer, the source, the drain electrode, the active layer, and the gate form a Schottky diode. Through utilizing a current hysteresis under a forward bias condition in a current-voltage characteristic of the Schottky diode under an illumination condition, when receiving light, a minimum voltage for turning on the thin-film transistor can be reduced, and an output current of the thin-film transistor can be controlled by a voltage applied to the gate and light applied to the photosensitive semiconductor layer, thereby achieving a control of a logic state of the thin-film transistor.

According to an embodiment of the present application, a material of the quasi-ohmic contact layer is graphite and a material of the photosensitive semiconductor layer is indium selenide.

Indium selenide is a typical two-dimensional layered semiconductor material with excellent electrical properties and a moderate and adjustable direct band gap, and has a spectral response that covers a range from near-infrared to ultraviolet. Indium selenide is selected as the photosensitive semiconductor, so that a material of the thin-film transistor can enhance a responsivity and a response speed of light of the thin-film transistor. Graphite has an electron affinity similar to an electron affinity of indium selenide. The quasi-ohmic contact layer made of graphite material is overlapped on the drain to construct a quasi-ohmic contact, which can weaken a Fermi level pinning at an interface, thereby facilitating input and output of a current.

According to an embodiment of the present application, a thickness of the quasi-ohmic contact layer ranges from 20 nanometers to 30 nanometers and a thickness of the photosensitive semiconductor layer ranges from 20 nanometers to 30 nanometers.

Through limiting thicknesses of both the quasi-ohmic contact layer and the photosensitive semiconductor layer to range from 20 nm to 30 nm, the thickness of the quasi-ohmic contact layer and the thickness of the photosensitive semiconductor layer can be prevented from being too thin which leads to fragmentations.

According to an embodiment of the present application, the photosensitive semiconductor layer and the quasi-ohmic contact layer are disposed on a side of the gate away from the base.

An embodiment of the present application further define that the thin-film transistor has a bottom gate structure, and the photosensitive semiconductor layer in the thin-film transistor of the bottom gate structure can receive light from an internal light source or an external light source, and achieve an effect of reducing a minimum voltage for turning on the thin-film transistor.

According to an embodiment of the present application, the photosensitive semiconductor layer and the quasi-ohmic contact layer are disposed on a side of the gate adjacent to the base.

An embodiment of the present application further define that the thin-film transistor has a top gate structure, and the photosensitive semiconductor layer in the thin-film transistor of the top gate structure can receive light from the internal light source or the external light source, and achieve the effect of reducing the minimum voltage for turning on the thin-film transistor.

According to an embodiment of the present application, the gate is made of a metal oxide material that is transparent and conductive.

Through selecting transparent conductive metal oxide as a material of the gate, the gate can be prevented from blocking light emitted to the photosensitive semiconductor layer, and light from the side of the photosensitive semiconductor layer adjacent to the gate and light from the side of the photosensitive semiconductor layer away the gate can both be received by the photosensitive semiconductor layer.

According to an embodiment of the present application, the metal oxide material includes metal oxides of any one of indium, tin, zinc, and cadmium; or, a multi-composite oxides composited by oxides of at least two metals.

Through selecting the metal oxides of any one of indium, tin, zinc, or cadmium; or, the multi-composite oxides composited by oxides of at least two metals as the material of the gate can ensure a transmittance of the gate and prevent the gate from blocking the light emitted to the photosensitive semiconductor layer.

According to an embodiment of the present application, the gate is made of metal.

When the material of the gate is metal, the photosensitive semiconductor layer can only receive the light from the side thereof away from the gate, so as to achieve the effect of reducing the minimum voltage for turning on the thin-film transistor.

According to an embodiment of the present application, a minimum voltage for turning on the thin-film transistor by the photosensitive semiconductor layer when receiving a specific illumination is a first voltage, a minimum voltage for turning on the thin-film transistor by the photosensitive semiconductor layer when not receiving a specific illumination is a second voltage, and the first voltage is lower than the second voltage.

Through utilizing characteristics of the thin-film transistor mentioned above, the output current of the thin-film transistor can be controlled by the voltage applied to the gate and the light applied to the photosensitive semiconductor layer, thereby achieving the control of the logic state of the thin-film transistor.

According to an embodiment of the present application, the array substrate includes a gate control line connected to the gate;
  when a low power consumption mode is executed, the photosensitive semiconductor layer continues to receive a specific illumination, when the gate control line applies a first turn-on voltage to the gate, the thin-film transistor is turned on, and the first turn-on voltage is greater than or equal to the first voltage and less than the second voltage.

The photosensitive semiconductor layer of the thin-film transistor is continuously illuminated by the specific illumination provided by the external light source or the internal light source, which can reduce the minimum voltage for turning on the thin-film transistor, and when the gate control line applies the first turn-on voltage to the gate of the thin-film transistor, the thin-film transistor is turned on, so as to achieve the effect of reducing power consumption.

According to an embodiment of the present application, the array substrate includes the gate control line connected to the gate;
  when a writing demonstration mode is executed, the gate control line applies a second turn-on voltage to the gate that is insufficient to turn on the thin-film transistor, until the photosensitive semiconductor layer receives a specific illumination, the thin-film transistor is turned on, and the second turn-on voltage is greater than or equal to the first voltage and less than the second voltage.

When the writing demonstration mode is executed, the gate control line can continuously apply the second turn-on voltage to the gate of the thin-film transistor that is insufficient to turn on the thin-film transistor, until the minimum voltage required to turn on the thin-film transistor is reduced when receiving the specific illumination, so as to turn on the thin-film transistor, thereby achieving a function of the writing demonstration mode.

According to the array substrate provided in abovementioned embodiments, the present application further provides a display panel, the display panel including: an array substrate;
  an opposite substrate disposed opposite to the array substrate;
  a liquid crystal layer disposed between the array substrate and the opposite substrate; and
  a backlight module disposed on a side of the array substrate away from the opposite substrate, wherein the array substrate includes:
  a base; and
  a thin-film transistor disposed on a side of the base, wherein the thin-film transistor includes:
  a gate;
  an active layer disposed on a side of the gate;
  a source disposed on a side of the active layer away from the gate and in contact with the active layer;
  a drain disposed on the side of the active layer away from the gate and in contact with the active layer, wherein a gap is defined between the source and the drain;
  a quasi-ohmic contact layer disposed on the side of the active layer away from the gate, wherein the quasi-ohmic contact layer is electrically connected to the drain; and
  a photosensitive semiconductor layer disposed on the side of the active layer away from the gate, wherein the photosensitive semiconductor layer is respectively electrically connected to the source and the quasi-ohmic contact layer.

According to an embodiment of the present application, an end of the quasi-ohmic contact layer is overlapped on a side of the drain that is away from the active layer, and two opposite ends of the photosensitive semiconductor layer are respectively overlapped on a side of the source away from the active layer and a side of the quasi-ohmic contact layer away from the active layer.

According to an embodiment of the present application, a material of the quasi-ohmic contact layer is graphite and a material of the photosensitive semiconductor layer is indium selenide.

According to an embodiment of the present application, a thickness of the quasi-ohmic contact layer ranges from 20 nanometers to 30 nanometers and a thickness of the photosensitive semiconductor layer ranges from 20 nanometers to 30 nanometers.

According to an embodiment of the present application, the photosensitive semiconductor layer and the quasi-ohmic contact layer are disposed on a side of the gate away from the base.

According to an embodiment of the present application, the photosensitive semiconductor layer and the quasi-ohmic contact layer are disposed on a side of the gate adjacent to the base.

According to an embodiment of the present application, the gate is made of metal or a metal oxide material that is transparent and conductive.

According to an embodiment of the present application, the metal oxide material includes metal oxides of any one of indium, tin, zinc, and cadmium; or, a multi-composite oxides composited by oxides of at least two metals.

Beneficial effects of embodiments of the present disclosure: The embodiments of the present application provide the array substrate and the display panel including the array substrate. The array substrate includes the base and the thin-film transistor disposed on the side of the base. The thin-film transistor includes the quasi-ohmic contact layer disposed on the side of the active layer and connected to the drain, and the photosensitive semiconductor layer connected to the source and the quasi-ohmic contact layer. Through emitting external or internal light to the photosensitive semiconductor, the turn-on voltage of the gate of the thin-film transistor can be reduced, so that the power consumption of the display panel can be reduced.

BRIEF DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF PRESENT EMBODIMENTS

Figure 1:
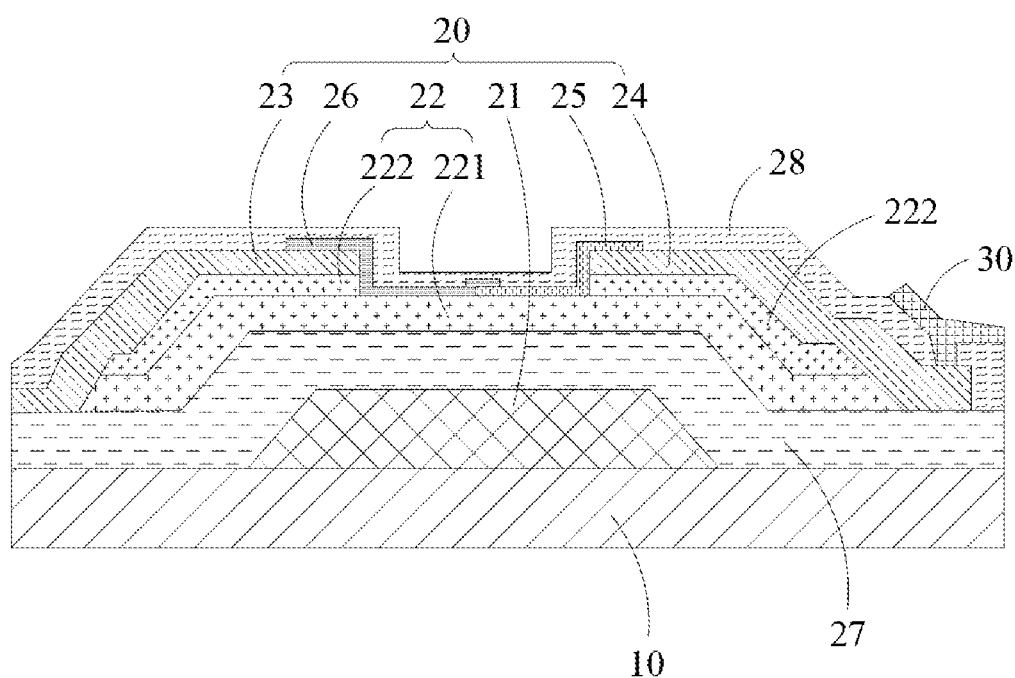
FIG. 1 is a structural schematic view of an array substrate provided by an embodiment of the present application.

Examples are described below with reference to the appended drawings, and the drawings illustrate particular embodiments in which the present application may be practiced. Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In the drawings, units of similar structures are using the same numeral to represent.

The present disclosure will be further described below in conjunction with the drawings and specific embodiments.

Embodiments of the present application provide an array substrate and a display panel, which can be configured for reducing a turn-on voltage of a gate of a thin-film transistor in the display panel and reduce power consumption of the display panel.

The array substrate includes a base 10, a plurality of thin-film transistors 20 arranged on the base 10 and distributed in an array, and a pixel electrode 30. A thin-film transistor 20 includes a gate 21, an active layer 22, a source 23, and a drain 24. The source 23 is disposed on a side of the active layer 22 away from the gate 21 and is in contact with the active layer 22. The drain 24 is disposed on the side of the active layer 22 away from the gate 21 and is in contact with the active layer 22, and a gap is defined between the source 23 and the drain 24.

In an embodiment of the present application, the active layer 22 includes a semiconductor layer 221 and an ohmic contact layer 222, the semiconductor layer 221 is provided on a side of the gate 21, and the ohmic contact layer 222 is provided on two opposite ends of the semiconductor layer 221 away from the gate 21, the source 23 is disposed on a side of one of the two ends of the ohmic contact layer 222 away from the semiconductor layer 221, and the drain 24 is disposed on a side of another one of the two ends of the ohmic contact layer 222 away from the semiconductor layer 221, and the pixel electrode 30 is electrically connected to the drain 24.

The thin-film transistor 20 further includes a quasi-ohmic contact layer 25 and a photosensitive semiconductor layer 26. The quasi-ohmic contact layer 25 is disposed in the gap between the source 23 and the drain 24 and is located on a side of the semiconductor layer 221 away from the gate 21. The quasi-ohmic contact layer 25 is electrically connected to the drain 24.

The photosensitive semiconductor layer 26 is disposed in the gap between the source 23 and the drain 24 and is located on the side of the semiconductor layer 221 away from the gate 21. The two opposite ends of the photosensitive semiconductor layer 26 are respectively electrically connected to the source 23 and the quasi-ohmic contact layer 25, and the quasi-ohmic contact layer 25 and the photosensitive semiconductor layer 26 fill the gap between the source 23 and the drain 24.

Through utilizing a current hysteresis effect of the thin-film transistor 20 under an illumination condition and under a forward bias condition in a current-voltage characteristic, an output current of the thin-film transistor 20 is controlled by a voltage and light applied to the gate 21, a control of a logic state and an optical storage function of the thin-film transistor 20 can be achieved.

In one embodiment, the thin-film transistor 20 has a bottom gate structure, and the quasi-ohmic contact layer 25 and the photosensitive semiconductor layer 26 are both disposed on a side of the gate 21 away from the base 10.

As shown in FIG. 1, which is a structural schematic view of the array substrate provided by an embodiment of the present application, the base 10 is a transparent glass substrate, so that light can be emitted to the photosensitive semiconductor layer 26 from a side of the base 10.

In some other embodiments, material of the base 10 can also be organic materials that are transparent, and the organic materials can include, but not limited to, one or a mixture of more of polyimide (PI), polyamide (PA), polycarbonate (PC), polyphenylene ether sulfone (PES), polyethylene terephthalate (PET), polyethylene naphthalate (PEN), polymethyl methacrylate (PMMA), or cyclic olefin copolymer (COC).

The gate 21 is disposed on a side of the base 10. It should be noted that the gate 21 being disposed on the side of the base 10 can indicate that the gate 21 is in direct contact with a surface of the base 10, or in indirect contact with the base 10.

A gate insulating layer 27 is laid planarized on a side of the base 10 and covers a surface of the side of the gate 21 away from the base 10. Material of the gate insulating layer 27 is inorganic materials that are transparent, and the inorganic material can include at least one or a mixture of silicon nitride, silicon oxide, or silicon oxynitride. The gate insulating layer 27 can be a single-layer structure formed by any one of the inorganic materials as mentioned above, or can be a double-layer or multi-layer structure formed by stacking one or more of the inorganic materials as mentioned above.

The semiconductor layer 221 is disposed on a side of the gate insulating layer 27 away from the gate 21, and a material of the semiconductor layer 221 is amorphous silicon (a-Si). The ohmic contact layer 222 is disposed on the two opposite ends of the side of the semiconductor layer 221 away from the gate 21. A material of the ohmic contact layer 222 is amorphous silicon (a-Si), and an ion doping concentration of the ohmic contact layer 222 is higher than an ion doping concentration of the semiconductor layer 221.

The source 23 is disposed on a side of the ohmic contact layer 222 away from the semiconductor layer 221, and the drain 24 is disposed on the side of the ohmic contact layer 222 away from the semiconductor layer 221. The source 23 is disposed in a same layer as the drain 24, and made of a same material as the drain 24.

In an embodiment of the present application, the source 23 and the drain 24 are both made of copper.

In some other embodiments, materials of the source 23 and the drain 24 are not limited to copper, but can also include any one or a combination of aluminum, molybdenum, copper, chromium, tungsten, tantalum, or titanium. The source 23 and the drain 24 can also be a single-layer metal film structure, or can be a double-layer or a multi-layer metal film structure.

The source 23 and the drain 24 are spaced apart from each other, an end of the quasi-ohmic contact layer 25 is overlapped on a side of the drain 24 away from the ohmic contact layer 222, and the two opposite ends of the photosensitive semiconductor layer 26 are respectively overlapped on a side of the source 23 away from the ohmic contact layer 222 and a side of the quasi-ohmic contact layer 25 away from the semiconductor layer 221. An insulating protection layer 28 is arranged on a side of the quasi-ohmic contact layer 25 and a side of the photosensitive semiconductor layer 26 away from the base 10, and covers the source 23 and the drain 24. The pixel electrode 30 is disposed on a side of the insulating protection layer 28 away from the base 10 and is connected to the drain 24 through a via hole penetrating through the insulating protection layer 28.

In this embodiment of the present application, a material of the pixel electrode 30 can be a metal oxide material that is transparent and conductive. The metal oxide material can include metal oxides of any one of indium, tin, zinc, and cadmium; or, a multi-composite oxides composited by oxides of at least two metals. For example, the metal oxide material can be any one of indium tin oxide (ITO), indium zinc oxide (IZO), indium oxide ($In_2O_3$), tin oxide ($SnO_2$), zinc oxide (ZnO), cadmium oxide (CdO), or aluminum-doped zinc oxide (AZO).

In an embodiment of the present application, a material of the photosensitive semiconductor layer 26 is two-dimensional indium selenide, and a material of the quasi-ohmic contact layer 25 is graphite. The two-dimensional indium selenide is a typical two-dimensional layered semiconductor material with excellent electrical properties and a moderate and adjustable direct band gap, and has a spectral response that covers a range from near-infrared to ultraviolet. Indium selenide is selected as the photosensitive semiconductor, so that a material of the thin-film transistor 20 can enhance a responsivity and a response speed of light of the thin-film transistor 20. Graphite has an electron affinity similar to an electron affinity of indium selenide. The quasi-ohmic contact layer 25 made of graphite material is overlapped on the drain 24 to construct a quasi-ohmic contact, which can weaken a Fermi level pinning at an interface, thereby facilitating input and output of a current.

The photosensitive semiconductor layer 26 and the thin-film transistor 20 formed by the quasi-ohmic contact layer 25, the source 23, the drain 24, etc. are metal-copper-two-dimensional-indium-selenide-graphite Schottky diode. Through utilizing the current hysteresis effect of the thin-film transistor 20 under the forward bias condition in the current-voltage characteristic under the illumination condition, the output current of the thin-film transistor 20 is controlled by the voltage applied to the gate 21 and the light applied to the photosensitive semiconductor layer 26, so as to control the logic state of the thin-film transistor 20.

Furthermore, a thickness of the quasi-ohmic contact layer 25 is greater than or equal to 20 nanometers and less than or equal to 30 nanometers, and a thickness of the photosensitive semiconductor layer 26 is greater than or equal to 20 nanometers and less than or equal to 30 nanometers. The thickness of the quasi-ohmic contact layer 25 and the thickness of the photosensitive semiconductor layer 26 can be equal or unequal. The thickness of the quasi-ohmic contact layer 25 can also be greater than the thickness of the photosensitive semiconductor layer 26, or can be smaller than the thickness of the photosensitive semiconductor layer 26, which are not limited herein.

For example, the thickness of the quasi-ohmic contact layer 25 can be 20 nanometers, 22 nanometers, 25 nanometers, 27 nanometers, 30 nanometers, etc., and the thickness of the photosensitive semiconductor layer 26 can be 20 nanometers, 23 nanometers, 26 nanometers, 27 nanometers, 30 nanometers, etc., so that thicknesses of film-layers of the photosensitive semiconductor layer 26 and the quasi-ohmic contact layer 25 are prevented from being too thin which leads to fragmentations.

A minimum voltage for turning on the thin-film transistor 20 by the photosensitive semiconductor layer 26 when receiving a specific illumination is a first voltage, and a minimum voltage for turning on the thin-film transistor 20 by the photosensitive semiconductor layer 26 when not receiving the specific illumination is a second voltage. The first voltage is lower than the second voltage.

Through adding the photosensitive semiconductor layer 26 and the quasi-ohmic contact layer 25 on the thin-film transistor 20, and connecting the quasi-ohmic contact layer 25 to the drain 24, the photosensitive semiconductor layer 26 is respectively connected to the source 23 and the quasi-ohmic contact layer 25, so as to emit light to the photosensitive semiconductor layer 26 to reduce minimum voltages for turning on the thin-film transistor 20.

In an embodiment of the present application, the display panel has a low power consumption mode. When the low power consumption mode is executed, a data line of the display panel applies a forward voltage to the source 23 of the thin-film transistor 20, and a gate control line applies a forward voltage to the gate 21 under certain illumination conditions. A low potential voltage is lower than the first voltage, and the thin-film transistor 20 cannot be normally turned on since a potential of the gate 21 is too low.

When the low power consumption mode is executed, a condition for triggering turning on of the thin-film transistor 20 is a first turn-on voltage. Under the specific illumination, when the gate control line applies the first turn-on voltage to the gate 21, since the first turn-on voltage is greater than or equal to the first voltage and less than the second voltage, the thin-film transistor 20 is turned on.

Compared with the second voltage for turning on the thin-film transistor 20 when not receiving the specific illumination, in an embodiment of the present application, the thin-film transistor 20 can be turned on with the first turn-on voltage that is lower when the thin-film transistor 20 receives the specific illumination, so that the power consumption of the display panel can be reduced.

It should be noted that, a light source of the specific illumination can be a light source in an external environment, or can be a light source inside the display panel.

Figure 2:
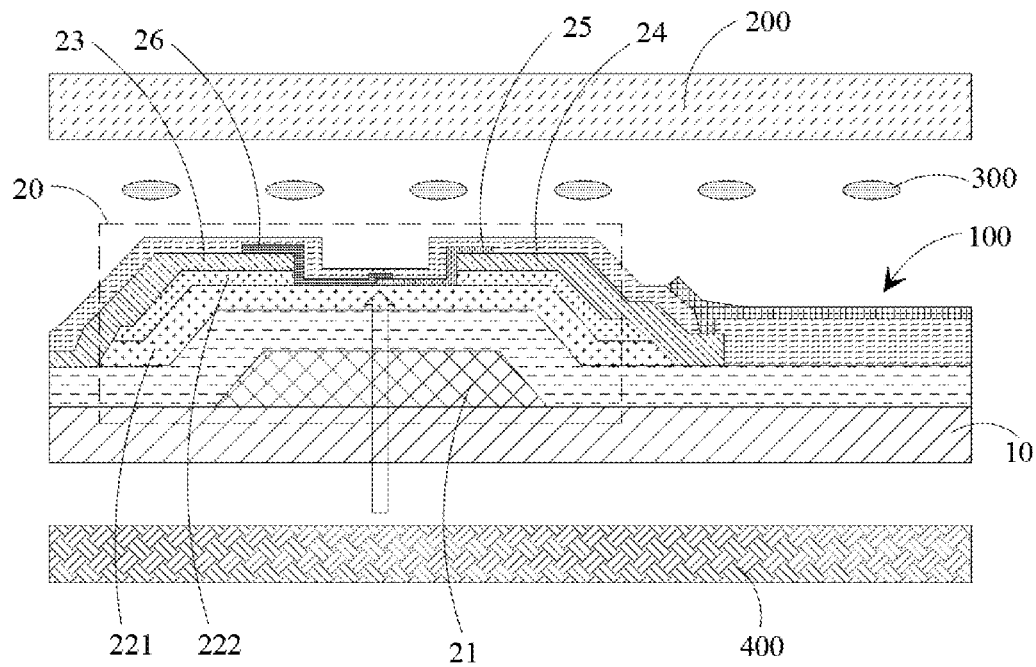
FIG. 2 is a schematic view of a first type of illumination mode of a display panel provided by an embodiment of the present application.

In an embodiment, as shown in FIG. 2, which is a schematic view of a first type of illumination mode of the display panel provided by an embodiment of the present application, the display panel shown in FIG. 2 is a liquid crystal display panel, and the display panel can includes an array substrate 100, an opposite substrate 200, a liquid crystal layer 30, and a backlight module 400. The array substrate 100 can be any of the array substrates provided in the embodiments of the present application. The array substrate 100 and the opposite substrate 200 are disposed opposite to each other, the liquid crystal layer 300 is disposed between the array substrate 100 and the opposite substrate 200, and the backlight module 400 is disposed on a side of the array substrate 100 away from the opposite substrate 200.

In the embodiment shown in FIG. 2, the array substrate 100 can include the base 10 and the thin-film transistor 20 in the embodiment shown in FIG. 1, and the opposite substrate 200 can include a glass substrate and a substrate disposed on a side of the glass substrate adjacent to a color filter layer on a side of the array substrate 100.

In an embodiment, the material of the gate 21 is a metal oxide material that is transparent and conductive, and light emitted by the backlight module 400 can penetrate the gate 21 in a direction indicated by an arrow in the figure, and emitted to the photosensitive semiconductor layer 26, thereby reducing the turn-on voltage of the thin-film transistor 20.

The metal oxide material can include metal oxides of any one of indium, tin, zinc, and cadmium; or, a multi-composite oxides composited by oxides of at least two metals. For example, the metal oxide material can be any one of indium tin oxide (ITO), indium zinc oxide (IZO), indium oxide ($In_2O_3$), tin oxide ($SnO_2$), zinc oxide (ZnO), cadmium oxide (CdO), or aluminum-doped zinc oxide (AZO).

In an embodiment, the material of the gate 21 can also be metal. In this case, the light source of the specific illumination can be the light source in an external environment. When an external ambient light source is sufficient, such as a strong illumination environment, light in the external environment can also be adopted to illuminate the photosensitive semiconductor layer 26 of the thin-film transistor 20 to reduce the turn-on voltage of the thin-film transistor 20, thereby reducing the power consumption of the display panel.

Specifically, the material of the gate 21 can be any one or a combination of metal materials such as aluminum, molybdenum, copper, chromium, tungsten, tantalum, titanium, etc.

The gate 21 can also be a single-layer metal film structure, or can be a double-layer or a multi-layer metal film structure.

Furthermore, the display panel can also have a writing demonstration mode, and when the writing demonstration mode is executed, a condition for triggering the turning on of the thin-film transistor 20 is a specific illumination, rather than a second turn-on voltage.

When the writing demonstration mode is executed, the gate control line can continue to apply a second turn-on voltage to the gate 21 under a condition without the specific illumination, and the second turn-on voltage is lower than the minimum voltage (i.e., the second voltage) of the photosensitive semiconductor layer 26 for turning on the thin-film transistor 20 when not receiving the specific illumination, and is greater than or equal to the minimum voltage (i.e., the first voltage) of the photosensitive semiconductor layer 26 for turning on the thin-film transistor 20 when receiving the specific illumination, so that the thin-film transistor 20 cannot be turned on. Until the photosensitive semiconductor layer 26 receives the specific illumination, and the minimum voltage for turning on the thin-film transistor 20 is reduced and is less than or equal to the second turn-on voltage, the thin-film transistor 20 can be turned on.

When the writing demonstration mode is executed, the light source of the specific illumination is an external light source.

It should be noted that a light intensity of the specific illumination when the low power consumption mode is executed can be different from the light intensity of the specific illumination when the writing demonstration mode is executed, and a magnitude of the first voltage when the low power consumption mode is executed can be different from the magnitude of the first voltage when the writing demonstration mode is performed.

Figure 3:
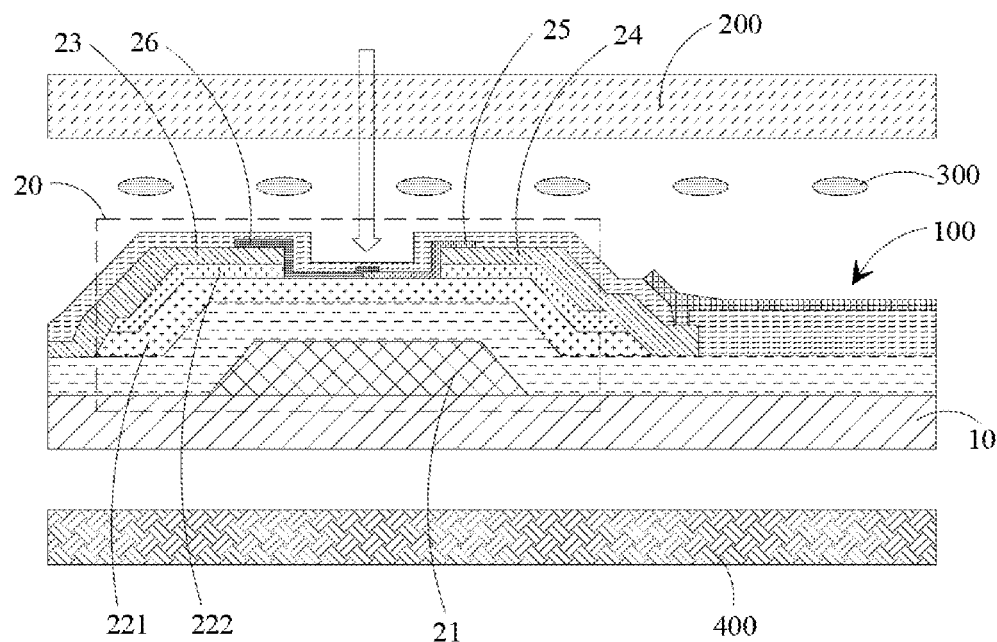
FIG. 3 is a schematic view of a second type of illumination mode of the display panel provided by an embodiment of the present application.

For example, as shown in FIG. 3, which is a schematic view of a second type of illumination mode of the display panel provided by an embodiment of the present application, the external light source can be an infrared pen or a laser pen. Strong light beams emitted by the external light source such as infrared pen, the laser pen, etc. can penetrate the opposite substrate 200 in a direction of an arrow shown in the figure, and emitted to the thin-film transistor 20, so as to reduce the minimum voltage for turning on the thin-film transistor 20 and turn on the thin-film transistor 20, thereby achieving the control of turning on and turning off the thin-film transistor 20 through the illumination condition. On the display panel, a function of writing demonstration under illuminations of beams as mentioned above can be achieved.

In an embodiment, the thin-film transistor 20 can also have a top gate structure.

Figure 4:
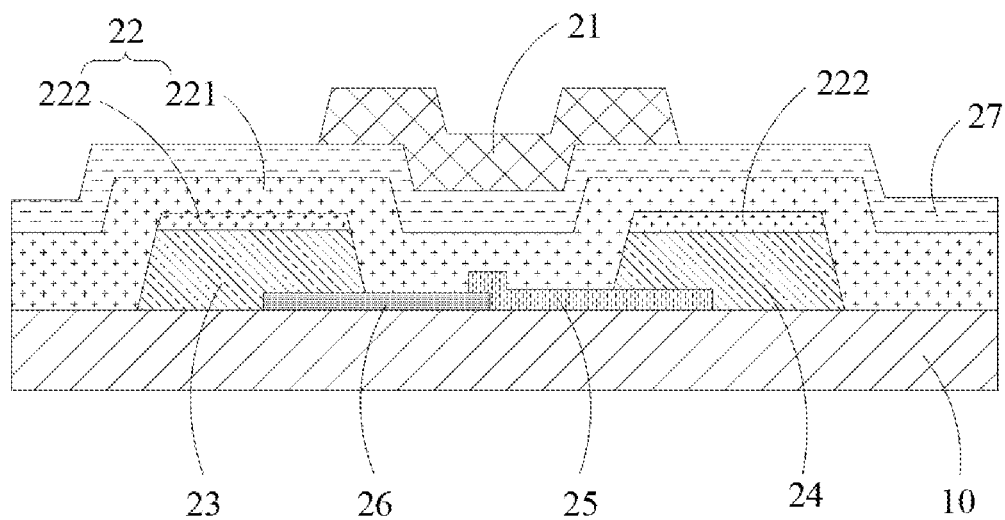
FIG. 4 is a structural schematic view of another type of the array substrate provided by an embodiment of the present application.

As shown in FIG. 4, which is a structural schematic view of another type of the array substrate provided by an embodiment of the present application, whose structure is substantially same as a structure of the array substrate shown in FIG. 1, except that the photosensitive semiconductor layer 26 and the quasi-ohmic contact layer 25 is disposed on a side of the gate 21 adjacent to the base 10.

As shown in FIG. 4, the photosensitive semiconductor layer 26 is disposed on a side of the base 10. It should be noted that the photosensitive semiconductor layer 26 being disposed on the side of the base 10 can indicate that the photosensitive semiconductor layer 26 is in direct contact with a surface of the base 10, or in indirect contact with the base 10.

The quasi-ohmic contact layer 25 is disposed on a side of the base 10, and an end of the quasi-ohmic contact layer 25 is overlapped on the side of the photosensitive semiconductor layer 26 away from the base 10. The source 23 is disposed on the side of the photosensitive semiconductor layer 26 away from the base 10, and is in direct contact with a surface of the side of the photosensitive semiconductor layer 26 away from the base 10. The drain 24 is disposed on a side of the quasi-ohmic contact layer 25 away from the base 10 and is in direct contact with a surface of the side of the quasi-ohmic contact layer 25 away from the base 10.

The ohmic contact layer 222 is respectively disposed on a side of the source 23 away from the base 10 and a side of the drain 24 away from the base 10, and the semiconductor layer 221 is disposed on a side of the ohmic contact layer 221 away from the base 10 and covers the surface of the side of the quasi-ohmic contact layer 25 and the surface of the side of the photosensitive semiconductor layer 26 away from the base 10. The gate insulating layer 27 is disposed on a side of the semiconductor layer 221 away from the base 10, and the gate 21 is disposed on a side of the gate insulating layer 27 away from the base 10 and is disposed opposite to the semiconductor layer 221.

In the embodiment shown in FIG. 4, if functions of the writing demonstration mode is require to be achieved, the material of the gate 21 can be a metal oxide material that is transparent and conductive, and the strong light beam outside the display panel can penetrate the gate 21, and be emitted to the photosensitive semiconductor layer 26.

Specifically, the metal oxide material can include metal oxides of any one of indium, tin, zinc, and cadmium; or, a multi-composite oxides composited by oxides of at least two metals. For example, the metal oxide material can be any one of indium tin oxide (ITO), indium zinc oxide (IZO), indium oxide ($In_2O_3$), tin oxide ($SnO_2$), zinc oxide (ZnO), cadmium oxide (CdO), or aluminum-doped zinc oxide (AZO).

In the embodiment shown in FIG. 4, if only the power consumption of the display panel is required to be reduced, the material of the gate 21 can be either the metal oxide material that is transparent and conductive in the above embodiments, or a metal material. The metal material can be any one or a combination of metal materials such as aluminum, molybdenum, copper, chromium, tungsten, tantalum, titanium, etc.

According to the display panel provided by the above embodiments of the present application, the embodiments of the present application further provide a display device, the display device includes a casing, a circuit board, a power supply, and the display panel provided by the above embodiments. The circuit board and the power supply can be installed in the casing, and the display panel can be installed on the casing. The display device can be a mobile terminal, such as a color electronic paper, a color e-book, a smart phone, etc. The display device can also be a wearable terminal, such as a smart watch, a smart bracelet, etc. The display device can also be a fixed terminal, such as a color electronic billboard, a color electronic poster, etc.

Beneficial effects of the embodiments of the present application: The embodiments of the present application provide the array substrate and the display panel including the array substrate. The array substrate includes the base and the thin-film transistor disposed on the side of the base. The thin-film transistor includes the quasi-ohmic contact layer disposed on the side of the semiconductor layer and connected to the drain, and the photosensitive semiconductor layer connected to the source and the quasi-ohmic contact layer. Through emitting external or internal light to the quasi-ohmic contact layer and the photosensitive semiconductor, the turn-on voltage of the gate of the thin-film transistor can be reduced, so that the power consumption of the display panel can be reduced.

Although the present application has been disclosed above with the preferred embodiments, it is not intended to limit the present application. Persons having ordinary skill in this technical field can still make various alterations and modifications without departing from the scope and spirit of this application. Therefore, the scope of the present application should be defined and protected by the following claims and their equivalents.

What is claimed is:

1. An array substrate comprising:
a base; and
a thin-film transistor disposed on a side of the base, wherein the thin-film transistor comprises:
a gate;
an active layer disposed on a side of the gate;
a source disposed on a side of the active layer away from the gate and in contact with the active layer;
a drain disposed on the side of the active layer away from the gate and in contact with the active layer, wherein a gap is defined between the source and the drain;
a quasi-ohmic contact layer disposed on the side of the active layer away from the gate, wherein the quasi-ohmic contact layer is electrically connected to the drain; and
a photosensitive semiconductor layer disposed on the side of the active layer away from the gate, wherein the photosensitive semiconductor layer is electrically connected to the source and the quasi-ohmic contact layer, respectively;
wherein an end of the quasi-ohmic contact layer is overlapped onto a side of the drain that is away from the active layer, and two opposite ends of the photosensitive semiconductor layer are respectively overlapped onto a side of the source away from the active layer and a side of the quasi-ohmic contact layer away from the active layer; and
wherein an orthographic projection of the source on the base does not overlap with an orthographic projection of the quasi-ohmic contact layer on the base, and an orthographic projection of the drain on the base does not overlap with an orthographic projection of the photosensitive semiconductor layer on the base.

2. The array substrate according to claim 1, wherein a material of the quasi-ohmic contact layer is graphite and a material of the photosensitive semiconductor layer is indium selenide.

3. The array substrate according to claim 1, wherein a thickness of the quasi-ohmic contact layer ranges from 20 nanometers to 30 nanometers and a thickness of the photosensitive semiconductor layer ranges from 20 nanometers to 30 nanometers.

4. The array substrate according to claim 1, wherein the photosensitive semiconductor layer and the quasi-ohmic contact layer are disposed on a side of the gate away from the base.

5. The array substrate according to claim 1, wherein the photosensitive semiconductor layer and the quasi-ohmic contact layer are disposed on a side of the gate adjacent to the base.

6. The array substrate according to claim 1, wherein the gate is made of a metal oxide material that is transparent and conductive.

7. The array substrate according to claim 6, wherein the metal oxide material comprises metal oxides of any one of indium, tin, zinc, and cadmium; or, a multi-composite oxides composited by oxides of at least two metals.

8. The array substrate according to claim 1, wherein the gate is made of metal.

9. The array substrate according to claim 1, wherein a minimum voltage for turning on the thin-film transistor by the photosensitive semiconductor layer in response to a specific illumination being received is a first voltage, a minimum voltage for turning on the thin-film transistor by the photosensitive semiconductor layer in response to a specific illumination being not received is a second voltage, and the first voltage is lower than the second voltage.

10. The array substrate according to claim 9, wherein the array substrate comprises a gate control line connected to the gate;
in response to a low power consumption mode being executed, the photosensitive semiconductor layer continues to receive a specific illumination, the gate control line applies a first turn-on voltage to the gate, the thin-film transistor is turned on, and the first turn-on voltage is greater than or equal to the first voltage and less than the second voltage.

11. The array substrate according to claim 9, wherein the array substrate comprises a gate control line connected to the gate;
in response to a writing demonstration mode being executed, the gate control line applies a second turn-on voltage to the gate that is insufficient to turn on the thin-film transistor, until the photosensitive semiconductor layer receives a specific illumination, the thin-film transistor is turned on, and the second turn-on voltage is greater than or equal to the first voltage and less than the second voltage.

12. A display panel comprising:
an array substrate;
an opposite substrate disposed opposite to the array substrate;
a liquid crystal layer disposed between the array substrate and the opposite substrate; and
a backlight module disposed on a side of the array substrate away from the opposite substrate, wherein the array substrate comprises:
a base; and
a thin-film transistor disposed on a side of the base, wherein the thin-film transistor comprises:
a gate;
an active layer disposed on a side of the gate;
a source disposed on a side of the active layer away from the gate and in contact with the active layer;
a drain disposed on the side of the active layer away from the gate and in contact with the active layer, wherein a gap is defined between the source and the drain;
a quasi-ohmic contact layer disposed on the side of the active layer away from the gate, wherein the quasi-ohmic contact layer is electrically connected to the drain; and
a photosensitive semiconductor layer disposed on the side of the active layer away from the gate, wherein the photosensitive semiconductor layer is respectively electrically connected to the source and the quasi-ohmic contact layer;
wherein an end of the quasi-ohmic contact layer is overlapped onto a side of the drain that is away from the active layer, and two opposite ends of the photosensitive semiconductor layer are respectively overlapped onto a side of the source away from the active layer and a side of the quasi-ohmic contact layer away from the active layer; and
wherein an orthographic projection of the source on the base does not overlap with an orthographic projection of the quasi-ohmic contact layer on the base, and an orthographic projection of the drain on the base does not overlap with an orthographic projection of the photosensitive semiconductor layer on the base.

13. The display panel according to claim 12, wherein a material of the quasi-ohmic contact layer is graphite and a material of the photosensitive semiconductor layer is indium selenide.

14. The display panel according to claim 12, wherein a thickness of the quasi-ohmic contact layer ranges from 20 nanometers to 30 nanometers and a thickness of the photosensitive semiconductor layer ranges from 20 nanometers to 30 nanometers.

15. The display panel according to claim 12, wherein the photosensitive semiconductor layer and the quasi-ohmic contact layer are disposed on a side of the gate away from the base.

16. The display panel according to claim 12, wherein the photosensitive semiconductor layer and the quasi-ohmic contact layer are disposed on a side of the gate adjacent to the base.

17. The array substrate according to claim 1, wherein an end of the quasi-ohmic contact layer away from the gap is in contact with a surface of the side of the drain away from the active layer, and an end of the photosensitive semiconductor layer away from the gap is in contact with a surface of the side of the source away from the active layer.

18. The display panel according to claim 12, wherein an end of the quasi-ohmic contact layer away from the gap is in contact with a surface of the side of the drain away from the active layer, and an end of the photosensitive semiconductor layer away from the gap is in contact with a surface of the side of the source away from the active layer.

19. The array substrate according to claim 1, wherein the photosensitive semiconductor layer comprises an overlapping portion overlapping the quasi-ohmic contact layer in a thickness direction of the array substrate, and an orthographic projection of the overlapping portion on the base is located within an orthographic projection of the gap on the base.

20. The display panel according to claim 12, wherein the photosensitive semiconductor layer comprises an overlapping portion overlapping the quasi-ohmic contact layer in a thickness direction of the array substrate, and an orthographic projection of the overlapping portion on the base is located within an orthographic projection of the gap on the base.

* * * * *